United States Patent
Bourez et al.

(10) Patent No.: US 9,096,934 B1
(45) Date of Patent: Aug. 4, 2015

(54) LOAD LOCK WITH VARIABLE CONDUCTANCE VALVE

(71) Applicant: WD Media, Inc., San Jose, CA (US)

(72) Inventors: Allen J. Bourez, San Jose, CA (US); Noe D. Taburaza, Union City, CA (US); Phi Cam Ha, Sacramento, CA (US)

(73) Assignee: WD Media, LLC, San Jose, CA (US)

( * ) Notice: Subject to any disclaimer, the term of this patent is extended or adjusted under 35 U.S.C. 154(b) by 274 days.

(21) Appl. No.: 13/665,764

(22) Filed: Oct. 31, 2012

(51) Int. Cl.
*C23C 14/54* (2006.01)
*C23C 14/56* (2006.01)

(52) U.S. Cl.
CPC .................. *C23C 14/566* (2013.01)

(58) Field of Classification Search
CPC ........ C23C 14/34; C23C 14/54; C23C 14/566
USPC ....................... 137/624.11, 565.01, 565.23, 1
See application file for complete search history.

(56) References Cited

U.S. PATENT DOCUMENTS

| | | | |
|---|---|---|---|
| 5,150,734 A | 9/1992 | Chiba | |
| 5,237,756 A | 8/1993 | Hurwitt | |
| 5,831,851 A | 11/1998 | Eastburn et al. | |
| 6,227,236 B1 | 5/2001 | Kusumoto et al. | |
| 6,419,455 B1 | 7/2002 | Rousseau et al. | |
| 7,472,581 B2 * | 1/2009 | Kitazawa et al. | 73/49.2 |
| 7,942,975 B2 * | 5/2011 | Moriya et al. | 134/3 |
| 2002/0134441 A1 | 9/2002 | Kusumoto et al. | |
| 2003/0230322 A1 | 12/2003 | Hillman et al. | |

* cited by examiner

*Primary Examiner* — Kevin Lee

(57) ABSTRACT

A station for a disk processing system includes a load lock chamber, a variable conductance valve configured to connect the chamber to a vacuum pump, and valve controller. The valve controller may include a processor that controls an electromechanical actuator to adjust the conductance of the valve during the evacuation of the chamber.

22 Claims, 5 Drawing Sheets

LOAD LOCK WITH VARIABLE CONDUCTANCE VALVE

FIELD

The present disclosure relates generally to load locks for disk processing systems and other machines, and more particularly to a load lock with a variable conductance valve for soft roughing the load lock chamber.

BACKGROUND

Disk processing systems are commonly used to manufacture magnetic disks for hard disk drives. These systems generally include several process stations that work together to deposit thin layers of material onto a substrate. Each process station comprises a sealed chamber which is maintained at a partial vacuum as a thin film deposition process is carried out. The chambers are coupled together in way that maintains the partial vacuum as the substrates are moved between the stations.

A load lock may be used to interface the vacuum controlled environment within the disk processing system with the external environment. Specifically, the load lock provides a means by which substrates may be loaded into the disk processing system without disturbing the internal vacuum controlled environment. The load lock comprises a load lock chamber and a pumping system. The loading process begins by sealing the load lock chamber and venting it to atmospheric pressure. One or more substrates are then introduced into the load lock chamber through a door or other passageway. The door is then closed to seal the load lock chamber. Once sealed, the load lock chamber is evacuated by a vacuum pump through a roughing valve until a partial vacuum is reached. The substrates are then removed from the load lock chamber through a gate valve which interfaces the chamber to a process station within the disk processing system. The gate valve is then closed and the load lock chamber is vented to atmospheric pressure before introducing more substrates into the chamber. A load lock may also be positioned at the output to the disk processing system to facilitate the removal of finished articles from the system in a similar manner.

The operation of the vacuum pump during the evacuation process tends to cause a turbulent flow of gas in the load lock chamber. As a result, microscopic particles on the inner surfaces of the chamber may become dislodged. These microscopic particles are carried by the flow and distributed throughout the chamber. Many of these particles come into contact with and adhere to the surface of the substrates within the chamber. These particles interfere with the deposition of material during downstream processes in the disk processing system, which results in defects in the finished article.

Accordingly, there is a need to reduce the particulate contamination of substrates in load locks during the evacuation process in disk processing systems and other machines.

SUMMARY

Several aspects of the present invention will be described more fully hereinafter with reference to various embodiments of apparatuses and methods related to load locks for disk processing systems and other machines.

One aspect of a load lock described in this disclosure includes a load lock chamber, a variable conductance valve configured to connect the chamber to a vacuum pump, and valve controller having an electromechanical actuator configured to control the conductance of the valve.

Another aspect of a load lock described in this disclosure includes a load lock chamber, a variable conductance valve configured to connect the chamber to a vacuum pump, and a valve controller comprising a processor having non-transitory machine readable media programmed with data, wherein the valve controller is configured to control the conductance of the valve based on the programmed data.

One aspect of a method for evacuating a load lock chamber described in this disclosure includes introducing one or more substrates into the chamber, and evacuating the chamber with a vacuum pump attached to the chamber through a variable conductance valve controlled by an electromechanical actuator.

Another aspect of a method for evacuating a load lock chamber described in this disclosure includes introducing one or more substrates into the chamber, and evacuating the chamber with a vacuum pump attached to the chamber through a variable conductance valve controlled by a processor based on data stored on non-transitory machine readable media.

It will be understood that other aspects of the present invention will become readily apparent to those skilled in the art from the following disclosure, wherein it is shown and described only several embodiments of the invention by way of illustration. As will be realized by those skilled in the art, the present invention is capable of other and different embodiments and its several details are capable of modification in various other respects, all without departing from the spirit and scope of the invention. Accordingly, the drawings and detailed description are to be regarded as illustrative in nature and not as restrictive.

BRIEF DESCRIPTION OF THE DRAWINGS

Various aspects of the present invention will now be presented in the detailed description by way of example, and not by way of limitation, in the accompanying drawings, wherein.

DETAILED DESCRIPTION

The detailed description is intended to provide a description of various exemplary embodiments of the present invention and is not intended to represent the only embodiments in which the invention may be practiced. The term "exemplary" used throughout this disclosure means "serving as an example, instance, or illustration," and should not necessarily be construed as preferred or advantageous over other embodiments. The detailed description includes specific details for the purpose of providing a thorough and complete disclosure that fully conveys the scope of the invention to those skilled in the art. However, the invention may be practiced without these specific details. In some instances, well-known processes, structures or components may be shown in block diagram form, or omitted entirely, in order to avoid obscuring the various concepts presented throughout this disclosure.

In the following detailed description, various aspects of the present invention will be presented in the context of a load lock for a disk processing system. While these inventive aspects may be well suited for this application, those skilled in the art will realize that these aspects may be extended to other processing systems to produce different articles. By way of example, various aspects of the present invention may be used in processing systems to manufacture semiconductors or any other suitable articles that require a partial vacuum during fabrication. Accordingly, any reference to a load lock in a disk processing system is intended only to illustrate the various aspects of the present invention, with the understanding that such aspects may have a wide range of applications.

Figure 1:
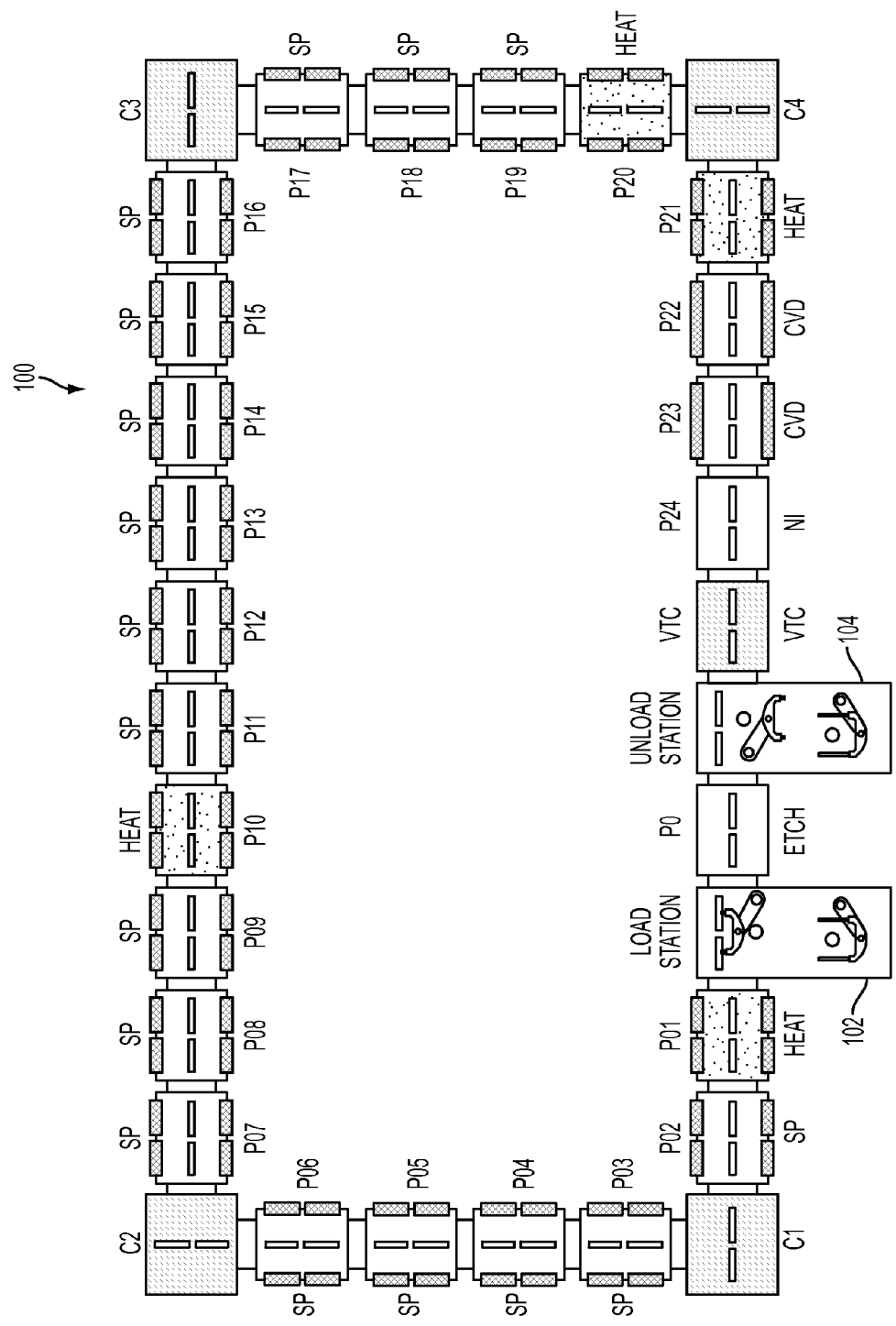
FIG. 1 is a schematic representation illustrating an exemplary embodiment of a disk processing system.

FIG. 1 is a schematic representation illustrating an exemplary embodiment of a disk processing system. The disk processing system 100 is shown with a number of process stations having four linear sections connected together by four corner process stations. Alternatively, the disk processing system may have one continuous linear section, or may be arranged in any other suitable fashion. The number of process stations may also vary depending on the particular application and the design requirements of the articles being manufactured. A disk transport system may be used to transport the disks on carriers through the process stations. Each process includes its own pumping system to maintain a partial vacuum within a process chamber. The process stations are connected together in a way that maintains a partial vacuum as the disks are transported between the stations. Examples of disk processing systems include the Anelva 3040 and 3050 manufactured by Canon Anelva Corporation, but the various aspects of the invention presented throughout this disclosure may be applied to any suitable disk processing systems or other machine.

The process stations work together to deposit thin layers of material onto substrates. This may be achieved by any combination of sputtering and chemical vapor deposition processes. Sputtering is a process whereby material is removed from a target and deposited onto the surface of a substrate. Chemical vapor deposition is a process whereby a stream of source gas reacts with the substrate to grow the desired material. The disk processing system may also have additional stations to support the deposition process including, by way of example, a loading station for introducing the disks into the system, heating stations to heat the disks, and an unloading station to remove the disks from the system.

In the exemplary embodiment shown in FIG. 1, the disks are loaded into the disk processing system 100 at a loading station 102. The disks are then heated at heating station P1 and then several layers of thin material are deposited onto the disks at sputtering stations P2-P9. This process is repeated with the disks being heated at heating station P10 and then several more layers of thin material being deposited onto the disks at sputtering stations P11-P19. The disks are then heated again at heating stations P20 and P21 before several more layers of thin material are deposited onto the disks using a chemical vapor deposition process at process stations P22-P23. At station P24 nitrogen may be implanted into the surface of the disks to provide better bonding of lubricant during post processing. The disks are then passed through a vacuum tunnel chamber (VTC) to an unloading station 104 where the disks are removed from the disk processing system 100. The carriers are then moved to an etching station P0 to remove residual deposition material before being provided back to the loading station 102 to transport new disks through the disk processing system 100. Although not shown, a load lock may be provided at the front end of the loading station 102 and the back end of the unloading station 104.

Figure 2:
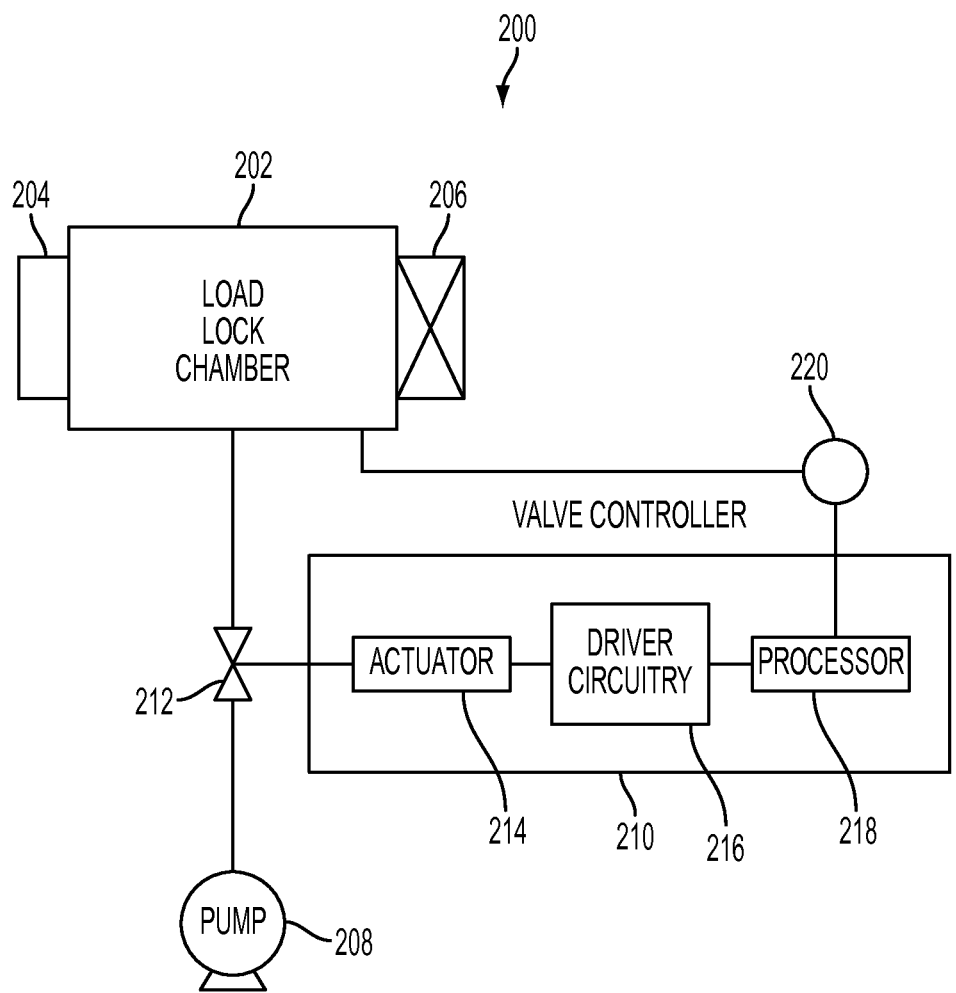
FIG. 2 is a schematic representation illustrating an exemplary embodiment of a load lock.

An exemplary embodiment of a load lock for the loading station will now be presented with reference to FIG. 2. Those skilled in the art will readily appreciate that the various aspects of the load lock that will now be present may be applied to a load lock for the unloading station. The load lock 200 is shown with an intermediate vacuum chamber, or as it is commonly referred to in the art, a load lock chamber 202. The load lock 200 also includes its own pumping system, which will be described in more detail later. The load lock chamber 202 is equipped with a door 204, which may be opened to introduce disks into the chamber 202. The load lock chamber 202 is connected to the disk processing system by a gate valve 206 that is large enough to allow the transport of disks from the load lock chamber 202 to the loading station.

The load lock 200 allows disks to be introduced into the disk processing system without disturbing the vacuum controlled environment. With the gate valve 206 closed, the load lock chamber 202 is vented to atmospheric pressure. The door 204 to the load lock chamber 202 is then opened and the disks introduced into the chamber. The disks are placed on a linear motion device (not shown) or other mechanism to transport the disks. The door 204 is then closed and the load lock chamber 202 is evacuated by a vacuum pump 208 through a roughing valve 212. Once a partial vacuum is reached in the load lock chamber 202, the gate valve 206 is opened and the disks are moved by the linear motion device into the loading station for robotic loading into the disk transport system within the disk processing system. The linear motion device is detached from the disks and removed from the loading station. The gate valve 206 is then closed and the load lock chamber 202 is vented back to atmospheric pressure.

A valve controller 210 may be configured to provide soft roughing of the load lock 200 to reduce turbulence during the evacuation process. This may be achieved with a variable conductance valve 212 that is controlled by the valve controller 210. The valve controller 210 may be configured to provide a slower flow rate at the beginning of the evacuation process and then gradually increase the flow rate in multiple stages as the evacuation process continues.

The valve 212 may be any suitable variable conductance valve capable of adjusting the flow rate between the vacuum pump 208 and the load lock chamber 202 during the evacuation process. In one exemplary embodiment of a load lock, the valve 212 may be a butterfly valve. A butterfly valve uses a rotatable disc (not shown) positioned in the center of the passageway between the vacuum pump 208 and the load lock chamber 202 to vary the conductance. A rod (not shown) passing through the disc is connected to the valve controller 210 which incrementally turns the disc in the passageway to throttle the gas flow during the evacuation process. Although a butterfly valve may be well suited for this application, other variable conductance valves may be used for soft roughing the load lock chamber 202. Those skilled in the art will be best suited for selecting the appropriate valve for any particular application depending on the articles being manufactured and their design requirements.

The valve controller 210 is shown with an electromechanical actuator 214, driver circuitry 216, and a processor 218. During the evacuation process, the processor 218 generates a series of commands. The driver circuitry 216 decodes the commands and provides the corresponding drive current to the electromechanical actuator 214 to incrementally adjust the opening of the valve 212. The term "electromechanical actuator" means any device that can adjust the position of a valve and which is controlled by an electric current.

Figure 3:
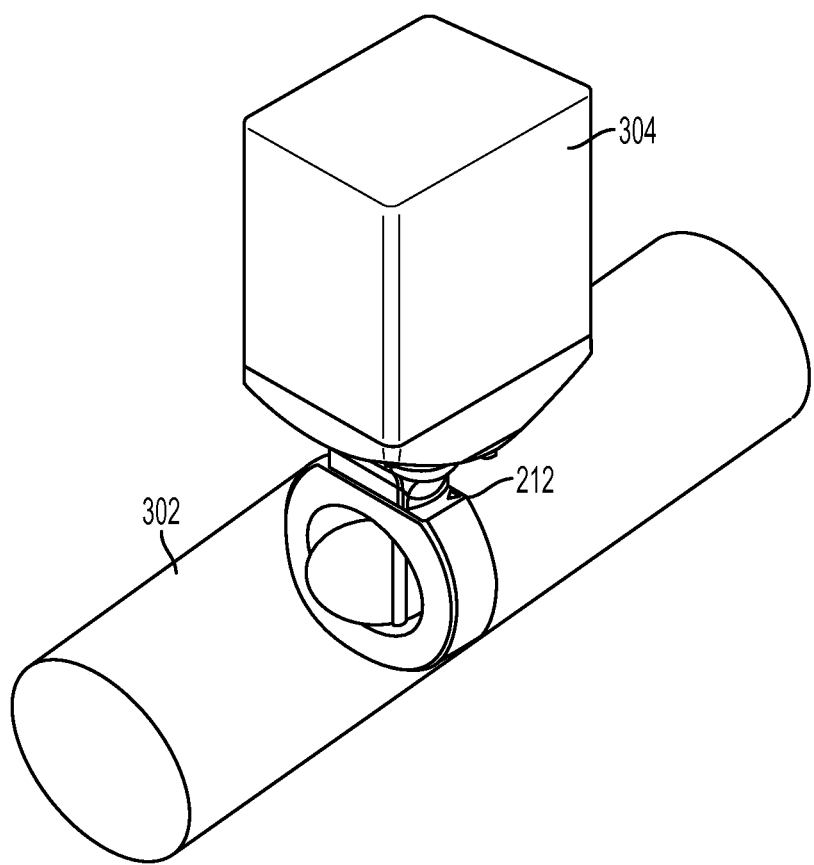
FIG. 3 is a perspective view illustrating an exemplary embodiment of a variable conductance valve.

FIG. 3 is a perspective view illustrating an exemplary embodiment of a variable conductance valve. Referring to FIGS. 2 and 3, the valve 212 may be situated in the passageway 302 between the load lock chamber 202 and the vacuum pump 208. A housing 304 is positioned proximate to valve 212 and houses the electromechanical actuator 214 and the driver circuitry 216. The housing may also be configured to house the processor 218. Alternatively, the processor 218 may be located remote from the housing 304 in what shall be referred to as a distributed valve controller. By way of example, the processor 218 may be part of a control panel for the disk processing system, or alternatively, part of an external computer system or other apparatus. An example of a variable conductance valve configured to operate with a distributed valve controller is a butterfly control and isolation valve, Series 615, manufactured by VAT Vakuumventile which supports an RS 232 interface to a remote processor. However, as those skilled in the art will readily appreciate, other distributed valve controllers may be used with remote processors having the same or different protocols for the remote interface.

The processor 218 may be implemented with one or more general-purpose and/or special-purpose processor units. Examples include microprocessors, microcontrollers, DSPs (Digital Signal Processors), FPGAs (Field Programmable Gate Arrays), PLDs (Programmable Logic Devices), PLCs (Programmable Logic Controllers), state machines, gated logic, discrete hardware components, or any other suitable circuitry, or any combination of circuits that can perform the various functionality described throughout this disclosure. The processor 218 may include machine readable media that can store software executable by one or more processor units. Software shall be construed broadly to mean instructions, data, or any combination thereof, whether referred to as software, firmware, middleware, microcode, hardware description language, or otherwise. Machine-readable media shall be construed broadly to include any non-transitory media that can store software including, by way of example, RAM (Random Access Memory), flash memory, ROM (Read-Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. Those skilled in the art will recognize how best to implement the described functionality for the processor 212 depending on the particular application and the overall design requirements for the articles being manufactured.

Figure 4:
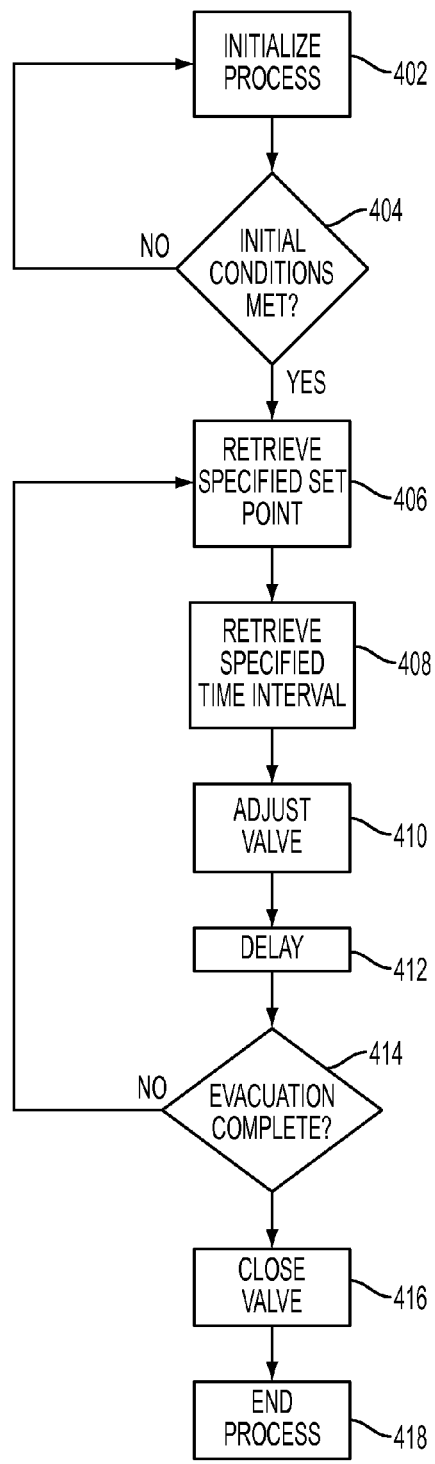
FIG. 4 is a flow chart representation of an exemplary process for controlling a variable conductance valve during the evacuation of a load lock chamber.

FIG. 4 is a flow chart that represents a process of controlling a variable conductance valve during evacuation of the load lock chamber. The process may be implemented by the processor in hardware, software, or any combination thereof. Referring to FIG. 4, the process is initialized in block 402. Once initialized, the processor determines whether the initial conditions are met for evacuation of the load lock chamber in block 404. By way of example, the processor may determine that the initial conditions are met when (i) the chamber is vented to atmospheric pressure; (ii) one or more substrates have been introduced into the chamber; and (iii) the chamber is sealed. The processor continues to loop back to the initialization state in block 402 until the initial conditions are satisfied.

Once the initial conditions are satisfied in block 404, the processor begins the evacuation process. The evacuation process involves incrementally increasing the conductance of the valve until the load lock chamber is evacuated. The processor retrieves a specified set point in block 406 and a specified time interval in step 408. The specified set point and time interval may be programmed and stored on machine readable media. Alternatively, the specified set point and time interval may be retrieved from hard wired circuits, internal dip switches, thumbwheel switches, or any other suitable components. The processor then adjusts the variable conductance valve in accordance with the specified set point in block 410. The processor then enters into a delay mode for the specified time interval in block 412. Once the time interval is up, the processor determines whether the evacuation process is complete in block 414. This may be determined, by way of example, when the variable conductance valve is completely open, or when the variable conductance valve has been set to a specified number of set points, or when some other criterion is met. If the processor determines that the evacuation process is not complete in block 414, the processor loops back to block 406 and retrieves a new set point and time interval. The process is then repeated until the processor determines in block 414 that the evacuation process is complete. The processor then closes the valve in block 416 for venting and ends the process in block 418.

Figure 5:
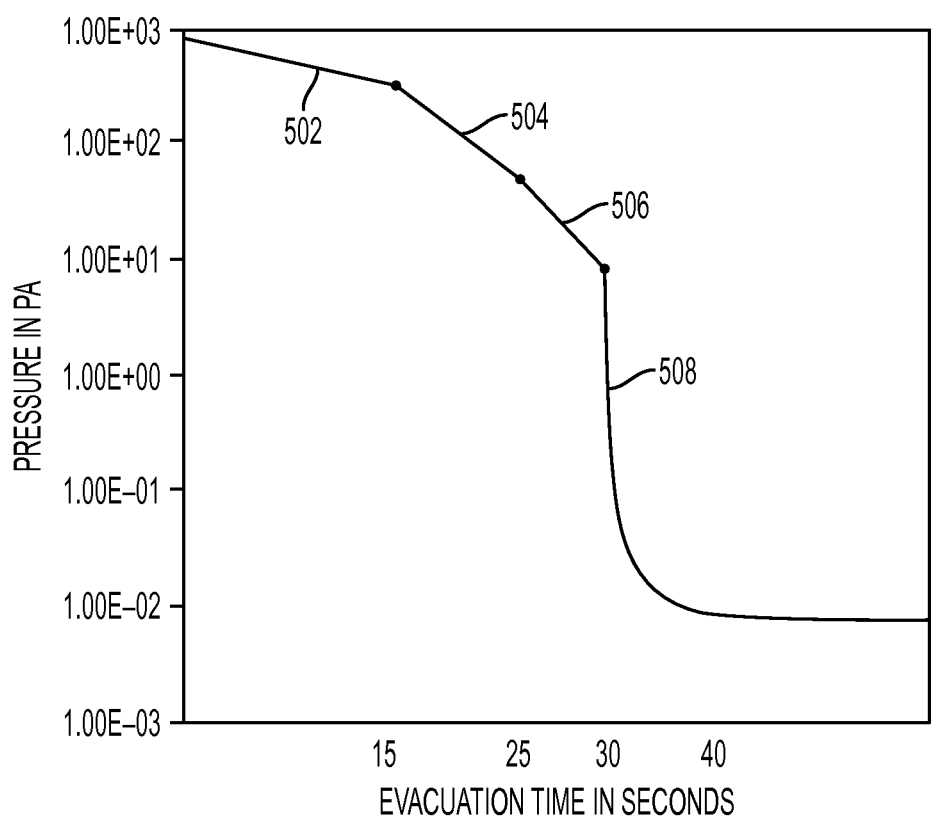
FIG. 5 is a graphical representation illustrating the decreasing pressure in the load lock chamber during the evacuation process of an exemplary embodiment of a load lock.

FIG. 5 is a graphical representation illustrating the decreasing pressure in the load lock chamber during the evacuation process of an exemplary embodiment of a load lock. The vertical axis represents the pressure in the load lock chamber in Pascal (Pa) and the horizontal axis represents time. In this example, the processor adjusts the variable conductance valve through 4 set points during the evacuation process. The initial set point is maintained for 15 seconds, the second set point is maintained for 10 seconds, and the third set point is maintained for 5 seconds. The final set point is used to completely open the valve until the load lock chamber reaches a partial vacuum.

Referring to FIG. 5, the initial set point results in a low conductance as represented by the slope of the curve 502 in FIG. 5. The low conductance at the beginning of the evacuation process tends to reduce turbulence in the load lock chamber. The flow rate is maintained for 15 seconds, at which point the conductance of the valve is increased in accordance with the second set point as represented by the increased slope of the curve 504. This increased flow rate is maintained for 10 more seconds, at which point the conductance of the valve is further increased in accordance with the third set point. This is represented by the increased slope of the curve 506. The flow rate is maintained for another 5 seconds to allow the load lock chamber to reach a sufficiently low pressure before the valve is completely opened by the processor 30 seconds into the evacuation process. Once the roughing valve is completely opened, the load lock chamber is evacuated to a partial vacuum. In this example, the entire process requires 40 seconds. The processor provides a controlled evacuation of the load lock chamber within a time period that does not impact the various downstream processes performed by the disk processing system. The controlled evacuation of the load lock chamber tends to reduce defects in the finished articles.

In the above example, the processor was programmed to cycle the roughing valve through 4 set points and to maintain each of the valve settings for a specified time interval. However, as those skilled in the art will readily appreciate, the processor may be programmed to cycle the variable conductance valve through any suitable number of valve settings with the valve being maintained at each setting for any suitable time.

Returning to FIG. 2, a pressure sensor 220 may be used to monitor the pressure in the load lock chamber 202 during the evacuation process. The output from the pressure sensor 220 is provided to the processor 218. The processor 218 determines whether the pressure in the load lock chamber 202 during the evacuation process reduces at a desired rate, as illustrated, by way of example, in FIG. 5. If the pressure drop in the load lock chamber 202 deviates from the desired result during evacuation, an alarm may be enabled in the processor 218 to alert the user that the processor 218 may need to be reprogrammed.

The various aspects of this disclosure are provided to enable one of ordinary skill in the art to practice the present invention. Various modifications to exemplary embodiments presented throughout this disclosure will be readily apparent to those skilled in the art, and the concepts disclosed herein may be extended to other machines. Thus, the claims are not intended to be limited to the various aspects of this disclosure, but are to be accorded the full scope consistent with the language of the claims. All structural and functional equivalents to the various components of the exemplary embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. A load lock, comprising:
   a load lock chamber;
   a variable conductance valve configured to connect the chamber to a vacuum pump; and
   a valve controller having an electromechanical actuator configured to control the conductance of the valve.

2. The load lock of claim 1 wherein the valve comprises a butterfly valve.

3. The load lock of claim 1 wherein the valve includes at least three valve settings each having a different conductance.

4. The load lock of claim 1 wherein the valve controller is further configured to adjust the valve through at least three valve settings during an evacuation of the chamber, each of the at least three valve settings having a different conductance.

5. The load lock of claim 4 wherein the valve controller is further configured to control the time the valve remains at each of the at least three valve settings during the evacuation of the chamber.

6. The load lock of claim 1 wherein the valve controller comprises a processor having non-transitory machine readable media programmed with data, wherein the valve controller is further configured to control the conductance of the valve based on the programmed data.

7. A load lock, comprising:
   a load lock chamber;
   a variable conductance valve configured to connect the chamber to a vacuum pump; and
   a valve controller comprising a processor having non-transitory machine readable media programmed with data, wherein the valve controller is configured to control the conductance of the valve based on the programmed data.

8. The load lock of claim 7 wherein the valve comprises a butterfly valve.

9. The load lock of claim 7 wherein the valve includes at least three valve settings each having a different conductance.

10. The load lock of claim 7 wherein the valve controller is further configured to adjust the valve through at least three valve settings during an evacuation of the chamber, each of the at least three valve settings having a different conductance.

11. The load lock of claim 10 wherein the valve controller is further configured to control the time the valve remains at each of the at least three valve settings during the evacuation of the chamber.

12. A method of evacuating a load lock chamber in a disk processing system, comprising:
   introducing one or more substrates into the chamber; and
   evacuating the chamber with a vacuum pump attached to the chamber through a variable conductance valve controlled by an electromechanical actuator.

13. The method of claim 12 further comprising removing the one or more substrates from the chamber after the chamber is evacuated.

14. The method of claim 13 further comprising venting the chamber after the one or more substrates are removed from the chamber.

15. The method of claim 12 wherein the evacuation of the chamber comprises adjusting the valve through at least three valve settings, each of the at least three valve settings having a different conductance.

16. The method of claim 15 wherein the evacuation of the chamber further comprises controlling the time the valve remains at each of the at least three valve settings.

17. The method of claim 12 wherein the evacuation of the chamber comprises adjusting the valve based on data stored on non-transitory machine readable media.

18. A method of evacuating a load lock chamber in a disk processing system, comprising:
   introducing one or more substrates into the chamber; and
   evacuating the chamber with a vacuum pump attached to the chamber through a variable conductance valve controlled by a processor based on data stored on non-transitory machine readable media.

19. The method of claim 18 further comprising removing the one or more substrates from the chamber after the chamber is evacuated.

20. The method of claim 19 further comprising venting the chamber after the one or more substrates are removed from the chamber.

21. The method of claim 18 wherein the evacuation of the chamber comprises adjusting the valve through at least three valve settings, each of the at least three valve settings having a different conductance.

22. The method of claim 21 wherein the evacuation of the chamber further comprises controlling the time the valve remains at each of the at least three valve settings.

* * * * *